United States Patent
Panteleev et al.

(10) Patent No.: US 11,095,317 B2
(45) Date of Patent: Aug. 17, 2021

(54) EFFICIENTLY DECODABLE QC-LDPC CODE

(71) Applicant: Huawei Technologies Co., Ltd., Shenzhen (CN)

(72) Inventors: Pavel Anatolyevich Panteleev, Moscow (RU); Gleb Vyacheslavovich Kalachev, Moscow (RU); Ivan Leonidovich Mazurenko, Moscow (RU); Elyar Eldarovich Gasanov, Moscow (RU); Yurii Sergeevich Shutkin, Moscow (RU)

(73) Assignee: Huawei Technologies Co., Ltd., Shenzhen (CN)

(*) Notice: Subject to any disclaimer, the term of this patent is extended or adjusted under 35 U.S.C. 154(b) by 96 days.

(21) Appl. No.: 16/506,696

(22) Filed: Jul. 9, 2019

(65) Prior Publication Data
US 2019/0334559 A1    Oct. 31, 2019

Related U.S. Application Data

(63) Continuation of application No. PCT/RU2017/000161, filed on Mar. 21, 2017.

(30) Foreign Application Priority Data

Mar. 21, 2017 (WO) ................ PCT/RU2017/000002

(51) Int. Cl.
*H03M 13/00* (2006.01)
*H03M 13/11* (2006.01)

(52) U.S. Cl.
CPC ..... *H03M 13/6502* (2013.01); *H03M 13/116* (2013.01)

(58) Field of Classification Search
CPC ........... H03M 13/6502; H03M 13/116; H03M 13/618; H03M 13/6393; H03M 13/6516;
(Continued)

(56) References Cited

U.S. PATENT DOCUMENTS 8,245,098 B2 * 8/2012 Han ................. H03M 13/3738
                                                714/752
9,236,886 B1   1/2016 Zhu et al.
(Continued)

FOREIGN PATENT DOCUMENTS

CN   101662290 A   3/2010
CN   101895300 A   11/2010
(Continued)

OTHER PUBLICATIONS

Declerq et al., "Channel Coding: Theory, Algorithms, and Applications," Academic Press Library in Mobile and Wireless Communications, pp. 1-667, Elsevier (2014).
(Continued)

*Primary Examiner* — James C Kerveros
(74) *Attorney, Agent, or Firm* — Leydig, Voit & Mayer, Ltd.

(57) ABSTRACT

A base matrix of a rate-adaptive irregular QC-LDPC code is provided, the base matrix being formed by columns and rows having entries representing circulant submatrices. The columns of the base matrix are divided into at least one or more higher weight first columns and lower weight second columns and the rows of the base matrix are divided into first high weight rows corresponding to the high rate mother code and second low weight rows corresponding to the extension part related to the lower rate codes. A first submatrix formed by an intersection of entries of the second columns and entries of the first and the second rows is divided into first quadratic submatrices, wherein at most one entry in each
(Continued)

column of each first submatrix and/or at most one entry in each row of each first submatrix is labelled.

20 Claims, 9 Drawing Sheets

(58) Field of Classification Search
CPC ........... H03M 13/1137; H03M 13/114; H03M 13/6561
USPC ........................................................ 714/776
See application file for complete search history.

(56) References Cited

U.S. PATENT DOCUMENTS

| | | | |
|---|---|---|---|
| 10,707,899 B2* | 7/2020 | Bhatia | H03M 13/1174 |
| 10,735,138 B2* | 8/2020 | Kalachev | H03M 13/6362 |
| 2005/0283709 A1 | 12/2005 | Kyung et al. | |
| 2006/0015802 A1 | 1/2006 | Hocevar | |
| 2006/0020870 A1 | 1/2006 | Hocevar | |
| 2008/0155385 A1 | 6/2008 | Jeong et al. | |
| 2013/0290816 A1* | 10/2013 | Shinohara | H03M 13/13 714/776 |
| 2015/0301887 A1 | 10/2015 | Zhang et al. | |

FOREIGN PATENT DOCUMENTS

| | | |
|---|---|---|
| CN | 102394660 A | 3/2012 |
| CN | 103618556 A | 3/2014 |
| CN | 104579576 A | 4/2015 |
| CN | 105680877 A | 6/2016 |
| EP | 2091171 A2 | 8/2009 |
| WO | 2018084735 A1 | 5/2018 |

OTHER PUBLICATIONS

Okamura, "A Hybrid ARQ Scheme Based on Rate-Compatible Low-Density Parity-Check Codes by Shortening and Extending," IEICE Trans. Fundamentals, vol. E92-A, No. 11, XP001550892, pp. 2883-2890, The Institute of Electronics, Information and Communication Engineers, Tokyo, Japan (Nov. 2009).
Fossorier et al., "Reduced Complexity Iterative Decoding of Low-Density Parity Check Codes Based on Belief Propagation" IEEE Transactions on Communications, vol. 47, No. 5, pp. 673-680, Institute of Electrical and Electronics Engineers, New York, New York (May 1999).
Chen et al., "Improved Min-Sum Decoding Algorithms for Irregular LDPC Codes," Proceedings of the 2005 IEEE International Symposium on Information Theory, pp. 1-5, Institute of Electrical and Electronics Engineers, New York, New York (Sep. 4-9, 2005).
Richardson et al.,"Efficient Encoding of Low-Density Parity-Check Codes," IEEE Transactions on Information Theory, vol. 47, No. 2, pp. 638-656, Institute of Electrical and Electronics Engineers, New York, New York (Feb. 2001).
Tanner, "A Recursive Approach to Low Complexity Codes", IEEE Transactions on Information Theory, vol. IT-27, No. 5, pp. 533-547, Institute of Electrical and Electronics Engineers, New York, New York (Sep. 1981).
Chang et al., Lower-Complexity Layered Belief-Propagation Decoding of LDPC Codes, 2008 IEEE International Conference on Communications, Beijing, China, pp. 1155-1160, Institute of Electrical and Electronics Engineers, New York, New York (May 19-23, 2008).
Fossorier, "Quasi-Cyclic Low-Density Parity-Check Codes from Circulant Permutation Matrices", IEEE Transactions on Information Theory, vol. 50, No. 8, pp. 1788-1793, Institute of Electrical and Electronics Engineers, New York, New York (Aug. 2004).
Richardson et al., "The Capacity of Low-Density Parity-Check Codes Under Message-Passing Decoding," IEEE Transactions on Information Theory, vol. 47, No. 2, pp. 599-619, Institute of Electrical and Electronics Engineers, New York, New York (Feb. 2001).
Hu et al., "Regular and Irregular Progressive Edge-Growth Tanner Graphs," IEEE Transactions on Information Theory, vol. 51, No. 1, pp. 386-398, Institute of Electrical and Electronics Engineers, New York, New York (Jan. 2005).
Vukobratovic et al., "ACE Spectrum of LDPC Codes," Journal of Automatic Control, vol. 16:33-36, University of Belgrade, Serbia (2006).
"Enhanced HARQ Method with Signal Constellation Rearrangement," TSG-RAN Working Group 1 Meeting #19, TSG R1#19(01)0237, Las Vegas, USA, pp. 1-11, Institute of Electrical and Electronics Engineers, New York, New York (Feb. 27-Mar. 2, 2001).
Gallager, "Low-Density Parity-Check Codes," IRE Transactions on Information Theory, pp. 21-28, Institute of Radio Engineers, New York, New York (Jan. 1962).
Mackay et al., "Good Codes based on Very Sparse Matrices," Cryptography and Coding, 5th IMA Conference, Lecture Notes in Computer Science, No. 1025, pp. 100-111, Springer-Verlag Berlin Heidenberg, Berlin/Heidenberg, Germany (1995).
Bates, "Using Rate-Adaptive LDPC Codes to Maximize the Capacity of SSDs," Flash Memory Summit 2013, Santa Clara, California (Aug. 12-15, 2013).
Xiao et al., "Improved Progressive-Edge-Growth (PEG) Construction of Irregular LDPC Codes," IEEE Communications Letters, vol. 8, No. 12, pp. 715-718, Institute of Electrical and Electronics Engineers, New York, New York (Dec. 2004).
Richardson, "Error Floors of LDPC Codes," Proceedings of the 41st Annual Conference on Communication, Control and Computing, Monticello, Illinois, pp. 1422-1435, University of Illinois, Urbana-Champaign, Illinois (Oct. 1-3, 2003).
"Quadrature amplitude modulation," Wikipedia, https://en.wikipedia.org/wiki/Quadrature_amplitude_modulation, retrieved Aug. 30, 2019.
"Part 11: Wireless LAN medium access control (MAC) and physical layer (PHY) specifications. Amendment 3: Enhancements for very high throughput in the 60 GHz band," IEEE Computer Society, IEEE Std 802.11-2012, pp. 1-2695, Institute of Electrical and Electronics Engineers, New York, New York (Mar. 29, 2012).
"Design of LDPC Code for High Throughput," 3GPP TSG RAN WG1 #85 R1-164813, Nanjing, China, pp. 1-3, 3rd Generation Partnership Project, Valbonne, France (May 23-27, 2016).
Divsalar et al., "Capacity-Approaching Protograph Codes," IEEE Journal on Selected Areas in Communications, vol. 27, No. 6, pp. 876-888, Institute of Electrical and Electronics Engineers, New York, New York (Aug. 2009).
Jin et al., "Irregular Repeat-Accumulate Codes," Proceedings of the Second International Symposium on Turbo Codes and Related Topics, Brest, France (Sep. 4-7, 2000).
"Adjusted Min-Sum decoders for LDPC Codes," 3GPP TSG-RAN WG1 #87, R1-1612083, pp. 1-16, Reno, USA, 3rd Generation Partnership Project, Valbonne, France (Nov. 14-18).
"5G", Wikipedia, https://en.wikipedia.org/wiki/5G, retrieved Aug. 30, 2019.
"Hybrid automatic repeat request," Wikipedia, https://en.wikipedia.org/wiki/Hybrid_automatic_repeat_request, retrieved Aug. 30, 2019.
Fossorier et al., "Channel Coding: Theory, Algorithms, and Applications," Academic Press, Cambridge, Massachusetts (Jul. 2014).
Yazdani et al., "On construction of rate-compatible low-density parity-check codes," IEEE Communications Letters, vol. 8, No. 3, pp. 159-161, Institute of Electrical and Electronics Engineers, New York, New York (Mar. 2004).
Park et al., "Low-Power High-Throughput LDPC Decoder Using Non-Refresh Embedded DRAM," IEEE Journal of Solid-State Circuits, vol. 49, No. 3, pp. 783-794, Institute of Electrical and Electronics Engineers, New York, New York (Mar. 2014).
Chen et al., "Protograph-Based Raptor-Like LDPC Codes," IEEE Transactions on Communications, vol. 63, No. 5, XP011581513, pp. 1522-1532, Institute of Electrical and Electronics Engineers, New York, New York (May 2015).
"LDPC rate compatible design," 3GPP TSG-RAN WG1 #86, Gothenburg, Sweden, R1-166370, pp. 1-26, 3rd Generation Partnership Project, Valbonne, France (Aug. 22-26, 2016).

(56) References Cited

OTHER PUBLICATIONS

Okamura, "A Hybrid ARQ Scheme Based on Rate-Compatible Low-Density Parity-Check Codes by Shortening and Extending," English Abstract, IEICE Transactions on Fundamentals of Electronics, Communications and Computer Sciences, vol. E92.A, No. 11, XP001550892, pp. 1-2, The Institute of Electronics, Information and Communication Engineers, Tokyo, Japan (Nov. 1, 2009).

Liu et al., "The serial message-passing schedule for LDPC decoding algorithms", Seventh International Conference on Graphic and Image Processing, Singapore, Singapore, XP060062605, pp. 1-7, Society of Photographic Instrumentation Engineers, Bellingham, Washington, USA (Dec. 9, 2015).

Sharon et al., "An Efficient Message-Passing Schedule for LDPC Decoding," 23rd IEEE Convention of Electrical and Electronics Engineers in Israel, Tel-Aviv, Israel, XP010743004, pp. 223-226, Institute of Electrical and Electronics Engineers, New York, New York (Sep. 6-7, 2004).

Richardson et al.," The Capacity of Low-Density Parity-Check Codes Under Message-Passing Decoding," IEEE Transactions on Information Theory, vol. 47, No. 2, pp. 599-618, Institute of Electrical and Electronics Engineers, New York, New York (Feb. 2001).

Xiao et al., "Improved Progressive-Edge-Growth (PEG) Construction of Irregular LDPC Codes," IEEE Communications Letters, vol. 8, No. 12, pp. 715-717, Institute of Electrical and Electronics Engineers, New York, New York (Dec. 2004).

Richardson, "Error Floors of LDPC Codes," Proceedings of the 41st Annual Conference on Communication, Control and Computing, Monticello, Illinois, pp. 1426-1435, University of Illinois, Urbana-Champaign, Illinois (Oct. 1-3, 2003).

"Adjusted Min-Sum decoders for LDPC Codes," 3GPP TSG-RAN WG1 #87, R1-1612083, pp. 1-16, Reno, USA, 3rd Generation Partnership Project, Valbonne, France (Nov. 14-18, 2016).

* cited by examiner

Fig. 6

| 385 | 11 | 179 | 441 | 238 | 44 | 368 | 387 | 209 | 258 | 83 | 101 | 491 | 66 | 355 | 118 | 0 | 0 | -1 | -1 | -1 | -1 | -1 | -1 | -1 | -1 |
|---|---|---|---|---|---|---|---|---|---|---|---|---|---|---|---|---|---|---|---|---|---|---|---|---|---|
| 256 | 52 | 32 | 411 | 217 | 451 | 316 | 215 | 470 | 91 | 169 | 84 | 57 | 102 | 77 | 361 | 1 | 0 | 0 | -1 | -1 | -1 | -1 | -1 | -1 | -1 |
| 81 | -1 | 239 | 480 | 171 | 33 | 310 | 436 | 207 | 118 | 220 | 296 | 358 | 412 | 507 | 85 | 0 | -1 | 0 | -1 | -1 | -1 | -1 | -1 | -1 | -1 |
| 180 | 338 | -1 | -1 | -1 | -1 | -1 | -1 | -1 | -1 | -1 | -1 | -1 | -1 | -1 | -1 | -1 | -1 | -1 | 0 | -1 | -1 | -1 | -1 | -1 | -1 |
| 288 | 208 | -1 | 138 | -1 | 198 | -1 | -1 | 351 | -1 | -1 | -1 | 191 | -1 | -1 | -1 | -1 | -1 | -1 | -1 | 0 | -1 | -1 | -1 | -1 | -1 |
| 20 | -1 | 264 | -1 | -1 | -1 | -1 | 97 | -1 | 166 | 370 | -1 | -1 | -1 | -1 | 23 | 344 | -1 | -1 | -1 | -1 | 0 | -1 | -1 | -1 | -1 |
| 293 | 402 | -1 | -1 | -1 | -1 | -1 | -1 | 77 | -1 | -1 | 152 | 27 | -1 | 437 | -1 | -1 | -1 | -1 | -1 | -1 | -1 | 0 | -1 | -1 | -1 |
| 225 | 268 | 387 | -1 | -1 | -1 | -1 | 253 | -1 | 381 | 7 | -1 | -1 | -1 | -1 | -1 | 22 | -1 | -1 | -1 | -1 | -1 | -1 | 0 | -1 | -1 |
| 290 | 339 | -1 | -1 | -1 | -1 | -1 | -1 | 260 | -1 | -1 | 116 | 53 | 127 | -1 | -1 | -1 | -1 | -1 | -1 | -1 | -1 | -1 | -1 | 0 | -1 |
| 110 | -1 | 193 | -1 | -1 | -1 | -1 | -1 | -1 | 54 | 88 | -1 | -1 | -1 | 26 | -1 | 297 | -1 | -1 | -1 | -1 | -1 | -1 | -1 | -1 | 0 |

EFFICIENTLY DECODABLE QC-LDPC CODE

CROSS REFERENCE TO RELATED APPLICATIONS

This application is a continuation of International Application No PCT/RU2017/000161, filed on Mar. 21, 2017, which claims priority to International Patent Application No. PCT/RU2017/000002, filed on Jan. 9, 2017. The disclosures of the aforementioned applications are hereby incorporated by reference in their entireties.

FIELD

Embodiments of the present disclosure relate to efficiently decodable Quasi-Cyclic Low-Density Parity-Check (QC-LDPC) code. In particular, embodiments of the present disclosure relate to efficiently decodable rate-adaptable QC-LDPC code which is based on a base matrix of an irregular QC-LDPC matrix.

BACKGROUND

FIG. 1 shows a block diagram illustrating a digital communications system 10 in which processes of the present disclosure may be implemented. The digital communications system 10 includes a transmitting side comprising an encoder 12 and a receiving side comprising a decoder 14. The input of the encoder 12 at the transmitting side is, for example, an information sequence $IS_1$ of k bits to which a redundancy sequence of r bits is added in an encoding operation performed by the encoder 12, thereby producing an encoded information sequence $IS_2$ of k+r=n bits which may be forwarded to a modulator 16.

The modulator 16 may transform the encoded sequence $IS_2$ into a modulated signal vector CH_IN which is in turn transmitted through a wired or wireless channel 18 such as, for example, a conductive wire, an optical fiber, a radio channel, a microwave channel or an infrared channel. Since the channel 18 is usually subject to noisy disturbances, the channel output CH_OUT may differ from the channel input CH_IN.

At the receiving side, the channel output vector CH_OUT may be processed by a demodulator 20 which produces some likelihood ratio. The decoder 14 may use the redundancy in the received information sequence $IS_3$ in a decoding operation performed by the decoder 14 to correct errors in the received information sequence $IS_3$ and produce a decoded information sequence $IS_4$ (cf. M. P. C. Fossorier et al., "Reduced Complexity Iterative Decoding of Low-Density Parity Check Codes Based on Belief Propagation", IEEE TRANSACTIONS ON COMMUNICATIONS, May 1999, Volume 47, Number 5, Pages 673-680, and J. Chen et al., "Improved min-sum decoding algorithms for irregular LDPC codes", PROCEEDINGS OF THE 2005 IEEE INTERNATIONAL SYMPOSIUM ON INFORMATION THEORY, Pages 449-453, September 2005). The decoded information sequence $IS_4$ is an estimate of the encoded information sequence $IS_2$ from which (an estimate of) the information sequence $IS_1$ can be extracted.

The encoding operation and the decoding operation may be governed by an LDPC code. In the general formulation of channel coding, an LDPC code may employ a generator matrix G for the encoding operation performed by the encoder 12 and a parity-check matrix H for the decoding operation performed by the decoder 14. For an LDPC code with an information sequence $IS_1$ of size 1×k, a codeword $IS_2$ of size 1×n, and a redundancy (parity) sequence of r=(n−k) bits, the generator matrix G has size k×n and the parity-check matrix H has size r×n=(n−k)×n.

The parity-check matrix $H_{r \times n}$ and the generator matrix $G_{k \times n}$ enjoy the orthogonality property, which states that for any generator matrix $G_{k \times n}$ with k linearly independent rows there exists a parity-check matrix $H_{r \times n}$ with r=(n−k) linearly independent rows. Thus, any row of the generator matrix $G_{k \times n}$ is orthogonal to the rows of the parity-check matrix $H_{r \times n}$ such that the following equation is satisfied:

$$G_{k \times n} \cdot H_{n \times r}^T = 0 \qquad (1)$$

The encoding operation can be performed by means of a multiplication between the information sequence $IS_1$ and the generator matrix $G_{k \times n}$, wherein the result of the multiplication is the encoded information sequence $IS_2$:

$$IS_2 = IS_1 \cdot G_{k \times n} \qquad (2)$$

At the receiving side, due to the orthogonality property between the generator matrix $G_{k \times n}$ and the parity-check matrix $H_{r \times n}$, the following equation should be satisfied:

$$H_{r \times n} \cdot IS_4^T = 0 \qquad (3)$$

where $IS_4$ is the decoded received information sequence of size 1×n. If the above equation is verified, the information sequence estimate $IS_4$ may be assumed to be correct.

Once the parity-check matrix $H_{r \times n}$ is generated, it is possible to obtain the generator matrix $G_{k \times n}$ and vice versa. Accordingly, any process of determining a parity-check matrix $H_{r \times n}$ may be mapped to an equivalent process of obtaining a generator matrix $G_{k \times n}$ and vice versa, so that any process disclosed throughout the description and claims in relation to determining a parity-check matrix $H_{r \times n}$ shall be understood as encompassing the equivalent process of obtaining a generator matrix $G_{k \times n}$ and vice versa.

Moreover, it should be noted that LDPC codes having a parity-check matrix $H_{r \times n}$ of a particular structure such as, for example, a parity-check matrix $H_{r \times n}$ having a parity part of dual diagonal structure allow the encoding of the information sequence $IS_1$ using (only) the parity-check matrix $H_{r \times n}$ so that obtaining the generator matrix $G_{k \times n}$ may not be required (cf. T. J. Richardson and R. L. Urbanke, "*Efficient encoding of low-density parity-check codes*", IEEE TRANSACTIONS ON INFORMATION THEORY, Volume 47, Issue 2, Pages 638-656, Feb. 2001).

A particular form of the parity-check matrix $H_{r \times n}$ is a regular QC-LDPC matrix $^{reg}H_{r \times n}^{QC}$ which can be divided into quadratic submatrices $I(p_{j,l})$, i.e. circulant matrices (or "circulants" for short), which may, for example, be obtained from cyclically right-shifting an N×N identity matrix I(0) by $p_{j,l}$ positions:

$$^{reg}H_{r \times n}^{QC} = \begin{bmatrix} I(p_{0,0}) & I(p_{0,1}) & \cdots & I(p_{0,L-1}) \\ I(p_{1,0}) & I(p_{1,1}) & & I(p_{1,L-1}) \\ \vdots & \vdots & \ddots & \vdots \\ I(p_{J-1,0}) & I(p_{J-1,1}) & \cdots & I(p_{J-1,L-1}) \end{bmatrix} \qquad (4)$$

with N=n/L (cf M. P. C. Fossorier, "*Quasi-Cyclic Low-Density Parity-Check Codes from Circulant Permutation Matrices*", IEEE TRANSACTIONS ON INFORMATION THEORY, Volume 50, Issue 8, Pages 1788-1793, August 2004). Thus, a regular QC-LDPC matrix $^{reg}H_{r \times n}^{QC}$ may be defined by a base matrix B which satisfies:

$$B = \begin{bmatrix} p_{0,0} & p_{0,1} & \cdots & p_{0,L-1} \\ p_{1,0} & p_{1,1} & & p_{1,L-1} \\ \vdots & \vdots & \ddots & \vdots \\ p_{J-1,0} & p_{J-1,1} & \cdots & p_{J-1,L-1} \end{bmatrix} \quad (5)$$

Moreover, a base matrix B of an irregular QC-LDPC matrix $^{irreg}H_{r \times n}^{QC}$ may be obtained by $^{irreg}H_{r \times n}^{QC} = B \circ M_{mask}$ where "$\circ$" denotes the Hadamard product and $$M_{mask} = \begin{bmatrix} m_{0,0} & m_{0,1} & \cdots & m_{0,L-1} \\ m_{1,0} & m_{1,1} & & m_{1,L-1} \\ \vdots & \vdots & \ddots & \vdots \\ m_{J-1,0} & m_{J-1,1} & \cdots & m_{J-1,L-1} \end{bmatrix} \quad (6)$$

denotes a mask matrix with $m_{j,l} \in \{0,1\}$. Alternatively, the base matrix B of an irregular QC-LDPC matrix $^{irreg}H_{r \times n}^{QC}$ may be obtained by (only) partially labelling the base matrix B with shift values $p_{j,l} \in \{0 \ldots N\}$ with not labelled entries (which are sometimes represented by a value of "−1" or an asterisk "*") representing zero matrices of size N×N.

Thus, for employing a QC-LDPC code in the encoder 12 and the decoder 14, the encoder 12 and the decoder 14 may be provided with a circulant, shift values, i.e., values corresponding to the labelled entries of the base matrix B, and (optionally) a mask matrix $M_{mask}$. For instance, an apparatus configured to choose shift values for determining a QC-LDPC matrix $H_{r \times n}^{QC}$ may provide the shift values to the encoder 12 and/or the decoder 14. Moreover, the encoder 12 and the decoder 14 may also be provided with a mask matrix $M_{mask}$ to generate one or more irregular QC-LDPC matrices $^{irreg}H_{r \times n}^{QC}$.

Furthermore, it is to note that a QC-LDPC matrix $H^{QC}$ (and more generally any LDPC code) can also be described by its equivalent bipartite graph ("Tanner graph"), wherein each edge of the Tanner graph connects one variable node of a plurality of variable nodes to one check node of a plurality of check nodes. For example, a QC-LDPC matrix $H_{r \times n}^{QC}$ of r rows and n columns can be represented by its equivalent bipartite graph with r check nodes and n variable nodes which has edges between the check nodes and the variable nodes if there are corresponding "1s" in the QC-LDPC matrix $H_{r \times n}^{QC}$ (cf. R. Tanner, "*A Recursive Approach to Low Complexity Codes*", IEEE TRANSACTIONS IN INFORMATION THEORY, Volume 27, Issue 5, Pages 533-547, September 1981). In this regard, it is to note that the variable nodes represent codeword bits and the check nodes represent parity-check equations.

While known approaches to channel coding have proven to perform well for a wide variety of scenarios, there is still an ongoing research to provide sophisticated solutions that achieve high data throughput with decent encoding/decoding resources.

SUMMARY

According to a first aspect of the present embodiment of the invention, there is provided a method comprising providing a base matrix of an irregular QC-LDPC code for encoding or decoding a sequence of information bits, wherein providing the base matrix comprises determining one or more first columns of the base matrix to have a higher weight than second columns of the base matrix, determining one or more first rows of the base matrix to have a higher weight than second rows of the base matrix, dividing a first submatrix formed by an intersection of entries of the second columns and entries of the second rows into first quadratic submatrices, labelling at most one entry in each column of each first quadratic submatrix and/or labelling at most one entry in each row of each first quadratic submatrix, and labelling entries of the one or more first columns and entries of the one or more first rows, wherein the labelled entries represent blocks of an irregular QC-LDPC matrix corresponding to circulant matrices and the not-labelled entries represent blocks of the irregular QC-LDPC matrix corresponding to zero matrices.

In this regard, it is noted that the term "circulant matrix" as used throughout the description and claims in particular refers to a quadratic matrix of size N×N, e.g., an identity matrix of size N, where each row vector is shifted one element to the right relative to the preceding row vector. Moreover, the term "circulant size" refers to the size N of the circulant and may be adapted to fit a desired length of the codeword $IS_2$. Furthermore, the term "base matrix" as used throughout the description and claims in particular refers to an array labelled with shift values, where each shift value of the base matrix gives the number of times by which the rows of the circulant, e.g., the identity matrix, are to be cyclically (right-) shifted to generate a submatrix (or block) of a QC-LDPC matrix corresponding to the base matrix.

In addition, it is to be noted that values forming a "matrix" do not necessarily have to be presented or physically stored in matrix- (or array-) form, or used in matrix algebra throughout a process involving the matrix. Rather the term "matrix" as used throughout the description and claims may equally refer to a set of (integer) values with assigned row and column indices or to a set of (integer) values which are stored in a (logical) memory array. Moreover, if not involving matrix algebra or if respective matrix algebra routines are suitably redefined, the notion of rows and columns may be inverted so that rows correspond to variable nodes and columns correspond to check nodes. Thus, although it is adhered to the notations and mathematical concepts regularly used in the art throughout the description and claims in which, for example, columns of a QC-LDPC matrix are mapped to variable nodes and rows of a QC-LDPC matrix are mapped to check nodes, they shall be understood as encompassing equivalent notations and mathematical concepts.

Furthermore, the term "weight" as used throughout the description and claims in particular refers to the number of entries in a row or a column of the base matrix that are labelled with shift values, i.e. the entries in the rows or columns of the base matrix that do not represent zero matrices, which is equal to the number of "1s" in the corresponding rows and columns of the irregular QC-LDPC matrix when using an identity matrix as circulant. In this regard, it is noted that the term "weight" as used throughout the description and claims may be interchanged with the terms "node degree" or "density" which have the same or a similar meaning. In addition, it is noted that an expression of the type "A and/or B" as used throughout the description and claims is intended to mean "A", "B", or "A and B".

Providing an irregular QC-LDPC code having a base matrix with a "very low weight" first submatrix and a comparatively smaller number of "higher weight" first columns and row(s) "embracing" the very low weight first submatrix improves decoding efficiency by promoting a "raptor-like" code structure (cf. Tsung-Yi Chen et al., "*Photograph-based raptor-like LDPC codes*", IEEE TRANSACTIONS ON COMMUNICATIONS, Volume 63, Issue 5, Pages 1522-1532, 2015) involving a higher weight "outer code" (corresponding to the one or more first rows) and a lower weight "inner code" (corresponding to the second rows).

Moreover, the structure of the inner code may be particularly susceptible to layered decoding operations (i.e., decoding operations following a layered decoding schedule) involving layers of the first quadratic submatrices of the very low weight first submatrix (forming part of the inner code) and flooding decoding operations (i.e., decoding operations following a flooding decoding schedule) involving the higher weight one or more first columns. (for the principle of layered and flooding decoding schedules and their performance see, for example, Y.-M. Chang et al., "*Lower-complexity layered belief-propagation decoding of LDPC codes*", 2008 IEEE INTERNATIONAL CONFERENCE ON COMMUNICATIONS, Pages 1155-1160, 2008).

In a first possible implementation form of the method according to the first aspect, there is at least one row order, involving all rows of the first submatrix, in which the rows of each of the first quadratic submatrices or in which the rows of the first submatrix, ordered according to the at least one row order, are free of vertically adjacent entries.

Hence, the orthogonally labelled first quadratic submatrices may be treated like circulants of larger size (e.g., 2N, 3N, 4N, etc.), thereby achieving a high degree of parallelism during decoding and a compact decoder structure while maintaining high quality code. Moreover, the structure of the first submatrix may allow for layered decoding operations involving a decoding order (i.e., the "at least one order") in which the number or length of stalls during the layered decoding operations induced by consecutively processed labelled row entries involving the same nodes is decreased.

In a second possible implementation form of the method according to the first aspect as such or according to the first implementation form of the first aspect, there is at least one row order, involving all rows of the first submatrix, in which all labelled entries of each column of a matrix formed by the rows of the first submatrix, ordered according to the at least one row order, are vertically separated by at least two not-labelled entries.

Hence, the structure of the first submatrix may be chosen to allow for layered decoding operations in which the number or length of stalls is even further reduced, even in cases of relatively long decoding pipelines at the decoder.

In a third possible implementation form of the method according to the first or second implementation form of the first aspect, the one or more first rows are first rows and labelling entries of the first rows further comprises dividing a second submatrix of the base matrix formed by an intersection of entries of the second columns and entries of the first rows into second quadratic submatrices and labelling at most one entry in each column of each second quadratic submatrix and/or labelling at most one entry in each row of each second quadratic submatrix.

Hence, the susceptibility of the code structure to layered decoding in regard to the second columns is increased which allows to further improve decoding efficiency.

In a fourth possible implementation form of the method according to the third implementation form of the first aspect, the rows of each of the second quadratic submatrices or the rows of the second submatrix, ordered according to the at least one row order, are free of vertically adjacent entries.

Hence, the structure of the second submatrix may be chosen to allow for layered decoding operations involving a decoding order in which the number or length of stalls during the layered decoding operations induced by consecutively processed labelled row entries involving the same nodes can be reduced.

In a fifth possible implementation form of the method according to the third implementation form of the first aspect, all labelled entries of each column of a matrix formed by the rows of the second submatrix, ordered according to the at least one row order, are vertically separated by at least two not-labelled entries.

Hence, the structure of the second submatrix may be chosen to allow for layered decoding operations in which the number or length of stalls can be further reduced.

In a sixth possible implementation form of the method according to any one of the first to the fifth implementation forms of the first aspect, there are one or more third submatrices of the base matrix, obtainable by removing one or more of the second rows and/or the second columns of the base matrix, wherein a number of labelled entries that are vertically adjacent or within a vertical distance in columns of a fourth matrix formed by rows of the first submatrix and corresponding one or more row vectors of the one or more first rows, reordered according to the at least one row order, of the base matrix and the one or more third submatrices, respectively, is below a threshold, wherein a highest threshold is assigned to the base matrix and a lowest threshold is assigned to the third submatrix corresponding to a QC-LDPC code having a highest rate of QC-LDPC codes corresponding to the one or more third submatrices.

Thus, the labelled entries of the one or more first rows provide a core base matrix of a "child" QC-LDPC code of the "mother" QC-LDPC code corresponding to the base matrix, wherein the second columns of the core base matrix contain less vertically adjacent labelled entries between decoding layers than the base matrix to allow for highest throughput during decoding of high rate code.

In a seventh possible implementation form of the method according to the sixth implementation form of the first aspect, the lowest threshold is one.

Hence, stalls induced by vertically adjacent labelled entries between decoding layers can be avoided for a highest rate code by effectively disallowing vertically adjacent labelled entries in regimes which are susceptible to layered decoding operations.

In an eighth possible implementation form of the method according to the sixth implementation form of the first aspect, the vertical distance is two.

Hence, the structure of the second columns may be chosen to allow for layered decoding operations in which the number or length of stalls can be further reduced.

In a ninth possible implementation form of the method according to the first aspect as such or according to any one of the first to the eighth implementation forms of the first aspect, a fourth submatrix of the irregular QC-LDPC matrix formed by blocks corresponding to an intersection of entries of a first subset of the second columns and entries of the first rows has a dual-diagonal or triangular structure.

Hence, encoding operations involving the outer code are facilitated as no Generator matrix is required for encoding.

In a tenth possible implementation form of the method according to the first aspect as such or according to any one of the first to the ninth implementation forms of the first aspect, a fifth submatrix of the irregular QC-LDPC matrix formed by blocks corresponding to an intersection of entries of a second subset of the second columns and entries of the second rows has a triangular or identity matrix structure.

Hence, encoding operations involving the inner code are facilitated.

In an eleventh possible implementation form of the method according to the first aspect as such or according to any one of the first to the tenth implementation forms of the first aspect, to-be-labelled entries of the second columns are identified by entries of a base matrix structure divided into blocks of circulant submatrices and zero submatrices.

Hence, storage requirements for storing the base matrix of the irregular QC-LDPC matrix can be reduced as the structure of the base matrix is given by the entries of the base matrix structure. Moreover, the base matrix structure can be used to enforce orthogonally labelling the first and/or second quadratic submatrices lending a double orthogonality property to the part of the irregular QC-LDPC matrix corresponding to the first and/or second submatrices.

In a twelfth possible implementation form of the method according to the eleventh implementation form of the first aspect, to-be-labelled entries of the first columns are identified by entries of the base matrix structure comprising blocks of multi-diagonal circulant submatrices.

In this regard, it is noted that the term "multi-diagonal circulant matrix" as used throughout the description and claims in particular refers to a circulant matrix where each column and row comprises a same number of non-zero entries, wherein the number is an integer larger than 1 as opposed to "single-diagonal circulant matrix", in which the number of non-zero entries in each column or row is 1. Hence, storage requirements for storing the base matrix of the irregular QC-LDPC matrix can be further reduced as non-orthogonally labelled parts of the base matrix can be accounted for by blocks of multi-diagonal circulant submatrices.

In a thirteenth possible implementation form of the method according to the first aspect as such or according to any one of the first to the twelfth implementation forms of the first aspect, the method further comprises determining a codeword corresponding to the sequence of information bits based on labelled entries of the provided base matrix.

Hence, the provided base matrix is operatively used in encoding operations which, for example, may comprise an outer code encoding operation (involving the outer code) and an inner code encoding operation (involving the inner code) performed after determining a part of the codeword using the outer code encoding operation.

In a fourteenth possible implementation form of the method according to the first aspect or according to one of the implementation forms of the first aspect, there is at least one row order, involving all rows of the base matrix, wherein rows of the base matrix ordered according to at least one row order, starting from a given row are orthogonal rows. Orthogonal rows are rows which are free of vertical adjacent entries.

In a fifteenth possible implementation form of the method according to the first aspect or according to one of the implementation forms of the first aspect, there is at least one row order, involving all rows of the base matrix, wherein a submatrix formed by a given set of rows of the base matrix, ordered according to the at least one order, consists of orthogonal groups of rows. Orthogonal groups of rows are groups of rows which are free of vertical adjacent entries.

In a further implementation form of the first aspect, there are no vertically adjacent pairs of labelled entries between the orthogonal groups of rows.

In a further implementation form of the first aspect, a number of conflicts between groups of orthogonal rows is limited by some threshold.

In a further implementation form of the method according to the first aspect, the method further comprises transmitting the codeword except for information bits that are indicated as punctured.

Hence, a transmission rate of the code can be increased.

In a further implementation form of the method according to the first aspect, the method further comprises indicating information bits corresponding to the one or more first columns as punctured.

In this regard, it is noted that the term "punctured" as used throughout the description and claims in relation to information bits (or the corresponding variable nodes or the corresponding columns) in particular indicates that the information bits are only used by the encoder but are not transmitted to or effectively treated as not received by the decoder. Even further, the term "corresponding" as used throughout the description and claims in relation to columns, nodes, and information bits in particular refers to the mapping between columns and variable nodes/information bits in terms of the Tanner graph representation of the irregular QC-LDPC matrix.

Hence, there may be a relatively small number of punctured columns, e.g., the columns corresponding to the one or more first columns which, however, have a relatively high weight (e.g., more than two times or three times the mean weight of the second columns) thereby providing good "connectivity" of the groups of mutually orthogonal rows of the first submatrix forming the layers for the layered decoding operations.

In a further implementation form of the method according to the first aspect, the method further comprises decoding a received sequence of information bits based on entries of the base matrix, wherein the decoding comprises flooding and layered decoding operations, wherein layered decoding operations are based on the first submatrix.

According to a second aspect of the present embodiment of the invention, there is provided a decoder comprising a non-transient memory storing entries of a base matrix of an irregular QC-LDPC code, wherein columns of the base matrix comprise one or more first columns and second columns, the second columns forming a matrix comprising groups of orthogonal rows, wherein the decoder is configured to decode a received sequence of information bits based on flooding decoding operations or flooding and layered decoding operations involving variable nodes corresponding to the one or more first columns and layered decoding operations involving nodes corresponding to the second columns.

Thus, as indicated above, decoding convergence can be improved while maintaining code quality and high parallelism of the decoding process, thereby enabling high throughput at a low error rate.

In a first possible implementation form of the decoder according to the second aspect, the decoder is further configured to process layered decoding operations corresponding to rows of the sixth submatrix in an order in which consecutively processed rows of different groups are free of vertically adjacent entries.

Hence, stalls induced to the layered decoding by vertically adjacent labelled entries can be avoided.

In a second possible implementation form of the decoder according to the second aspect, the decoder is further configured to neglect rows of the base matrix corresponding to one or more of the groups of orthogonal rows and corresponding columns of the base matrix in a decoding process to adapt the base matrix to a different coding rate, wherein the decoder is further configured to process layered decoding operations corresponding to rows of the sixth submatrix of the base matrix and the adapted base matrix, respectively, in an order in which vertically adjacent entries of consecutively processed rows of different groups are minimized.

Hence, stalls induced to the layered decoding by vertically adjacent labelled entries can be reduced for different code rates.

According to a third aspect of the present embodiment of the invention, there is provided a non-transient computer-readable medium storing instructions which, when carried out by a computer cause the computer to provide a base matrix of an irregular QC-LDPC matrix, the base matrix being formed by columns and rows having entries representing blocks of the irregular QC-LDPC matrix, wherein one or more first columns of the base matrix have a higher weight than second columns of the base matrix and one or more first rows of the base matrix have a higher weight than second rows of the base matrix and wherein a first submatrix formed by an intersection of entries of the second columns and entries of the first and the second rows is divided into first submatrices, the rows of the first submatrices being orthogonally labelled.

Thus, as indicated above, decoding efficiency can be improved by promoting a "raptor-like" code structure involving a higher weight outer code (corresponding to the one or more first rows) and a lower weight inner code (corresponding to the second rows), which is particularly susceptible to layered decoding operations involving an orthogonally labelled "very low weight" first submatrix (forming part of the inner code) and flooding decoding operations in regard to the one or more higher weight first columns. Moreover, the first submatrices can, if quadratic and also having orthogonally labelled columns, be treated as single circulants of larger size (e.g., 2N, 3N, 4N, etc.), thereby achieving a high degree of parallelism during decoding and a compact decoder structure while maintaining high quality code.

BRIEF DESCRIPTION OF THE DRAWINGS

FIG. 6 shows conflicts between layers of an exemplary base matrix of an irregular QC-LDPC code;

FIG. 10 shows an example of an irregular QC-LDPC matrix according to one of the embodiments.

DETAILED DESCRIPTION

Figure 1:
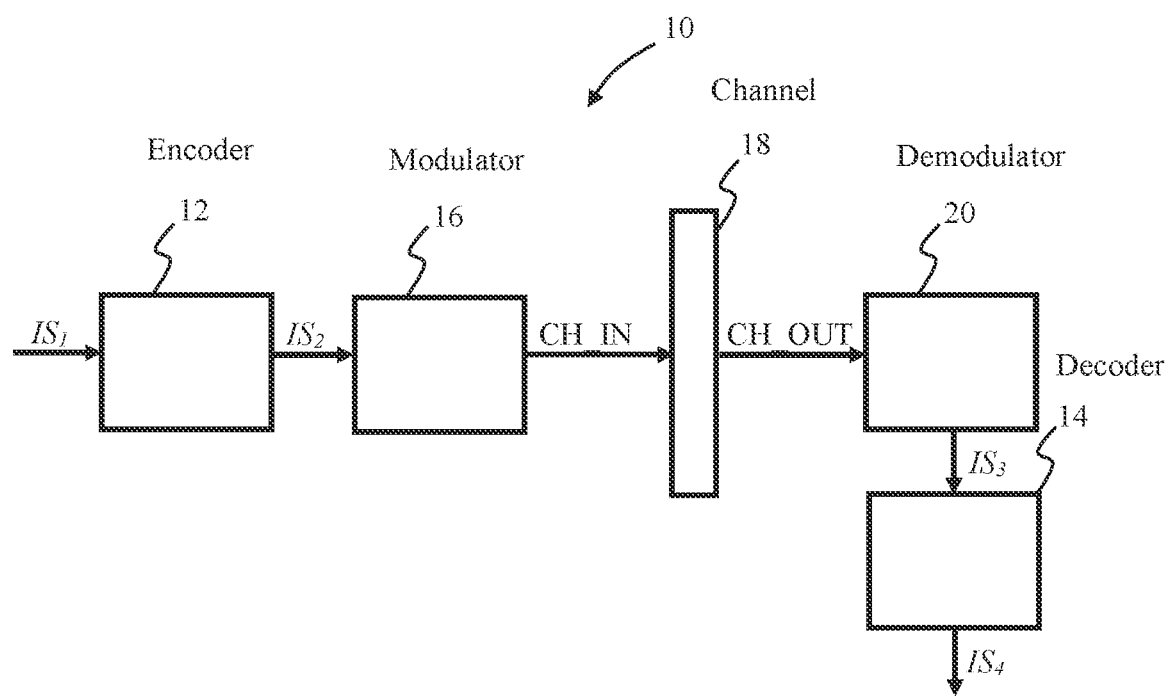
FIG. 1 shows a schematic illustration of a digital communication system.
Figure 2:
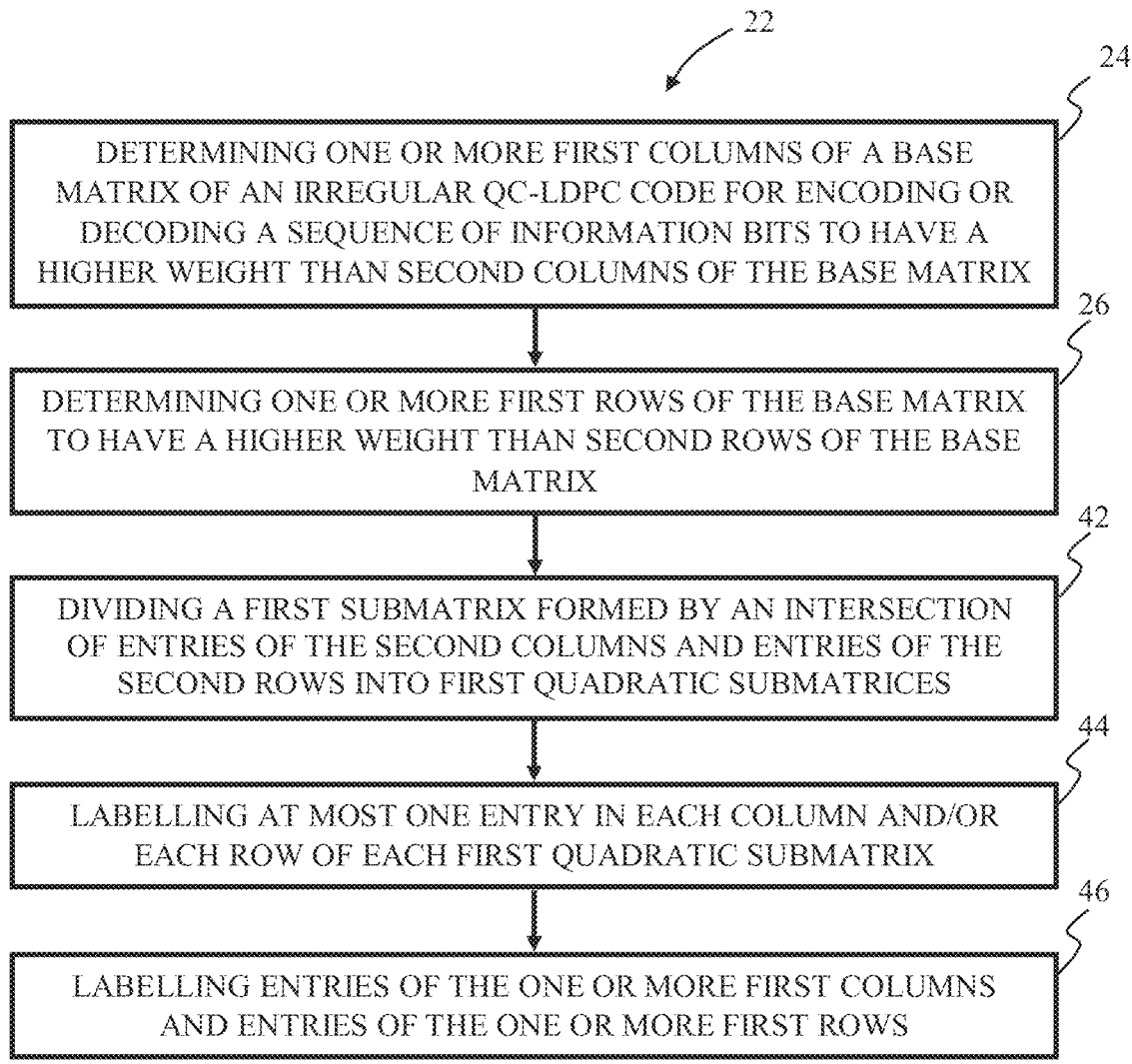
FIG. 2 shows a flow chart of a process of providing a base matrix of an irregular QC-LDPC code for encoding or decoding a sequence of information bits.
Figure 3:
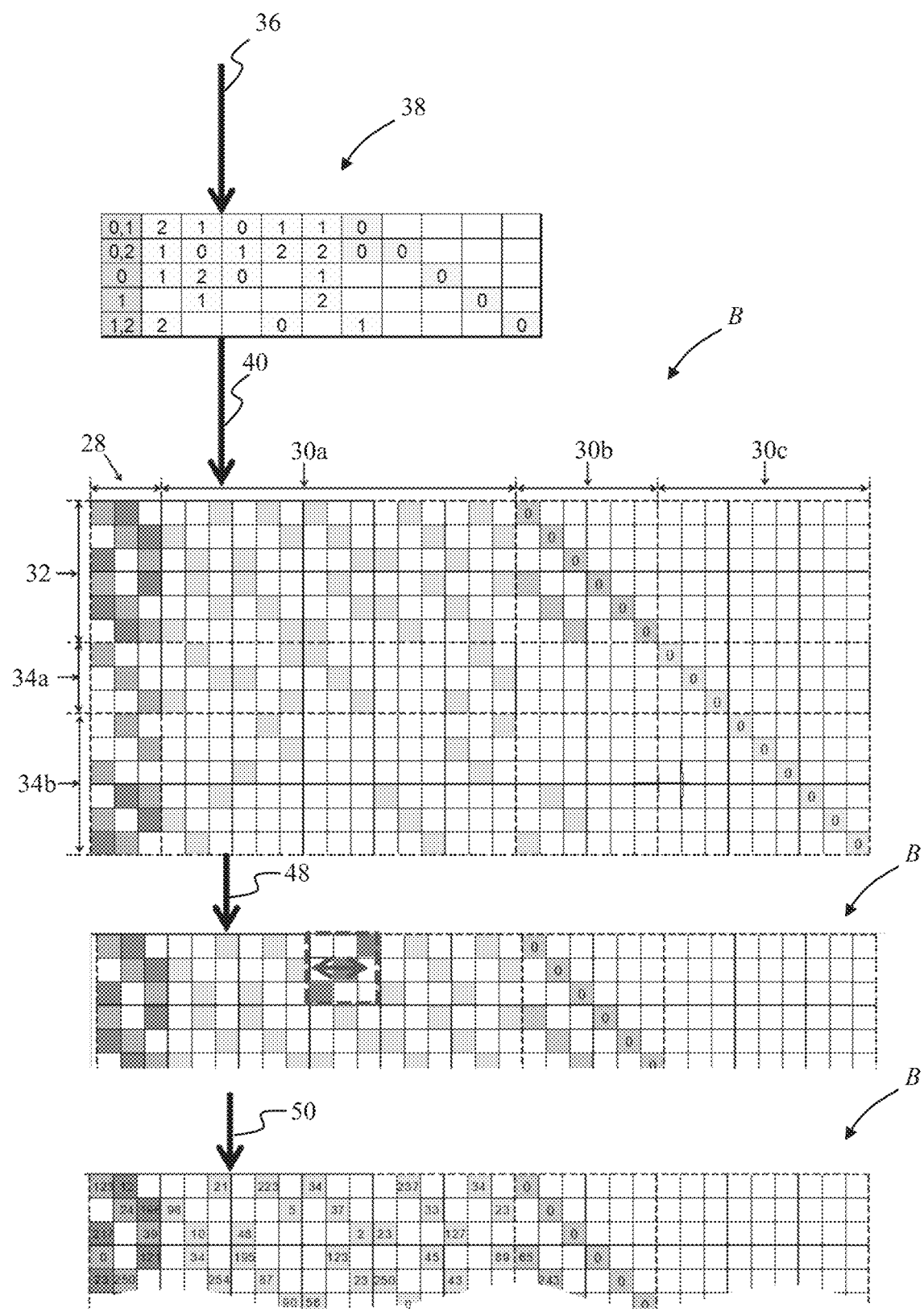
FIG. 3 further illustrates the process of FIG. 2.

FIG. 2 and FIG. 3 relate to a process 22 of providing an irregular QC-LDPC code for encoding or decoding a sequence of information bits, such as, for example, information sequence $IS_1$ and $IS_3$, respectively. The process 22 may, for example, be computer-implemented. For instance, the process 22 may be implemented by persistently stored computer-readable instructions which, if executed by a computer, cause the computer to perform the process 22. The entries of the provided base matrix B of the irregular QC-LDPC code may, for example, be provided to the encoder 12 and the decoder 14 of the digital communication system 10 and used for encoding or decoding operations performed by the encoder 12 and the decoder 14, respectively, i.e., for encoding or decoding the sequence of information bits $IS_1$ and $IS_3$, respectively.

The process 22 of providing an irregular QC-LDPC code for encoding or decoding a sequence of information bits may start at step 24 and step 26 with determining one or more first columns 28 of a base matrix B of an irregular QC-LDPC code to have a higher weight than second columns 30a-30c of the base matrix B and one or more first rows 32 of the base matrix B to have a higher weight than second rows 34a, 34b of the base matrix B. For example, as shown in FIG. 3, determining the one or more first columns 28 of the base matrix B may involve a step 36 of generating a base matrix structure 38. The base matrix structure 38 may be divided into blocks of (multi-diagonal) circulant submatrices (indicated in the particular example shown in FIG. 3 by circulant shifts ranging from 1 to 3 although other ranges are possible) and zero submatrices (indicated in the particular example shown in FIG. 3 by not-labelled, blank, entries) which may serve to identify to-be-labelled entries of the base matrix B at step 40.

As illustrated in FIG. 3, the intersection of the second columns 30a-30b and the second rows 34a, 34b forms a first submatrix that can be divided, as indicated at step 42 of the flow chart shown in FIG. 2, into first quadratic submatrices of a first size (e.g., size 3 as exemplary shown in FIG. 3, although the size may also be 2, 4, 5, etc.) which are to be orthogonally labelled as indicated at step 44 of the flow chart, thereby dividing the first submatrix into layers of groups of orthogonally labelled rows, wherein the number of orthogonally labelled rows corresponds to the first size. In the particular example of FIG. 3, the same applies to the intersection of the second columns 30a-30b and the first rows 32 which forms a second submatrix.

However, it is to be noted that the second submatrix may also be divided into second quadratic submatrices of a second size, equal to or smaller than the first size, which are to be orthogonally labelled, and/or into second quadratic submatrices of the second size, which are not to be orthogonally labelled. Moreover, preceding the labelling procedure indicated at steps 44, 46 of the flow chart shown in FIG. 2, one or more of the quadratic submatrices may be replaced with one or more differently orthogonally labelled quadratic submatrix, as exemplary illustrated at step 48 depicted in FIG. 3. In particular, said replacing may serve to increase code performance or to decrease a number of vertically adjacent entries of different decoding layers, as will be discussed in further detail below.

At step 50 shown in FIG. 3, labelling the entries of the base matrix B may be finalized by associating a shift value with each to-be-labelled entry. In this regard, it may be noted that different ranges may be chosen for the shift values to support different codeword lengths and that the selection of shift values within the chosen range may involve one or more optimization techniques in view of overall code performance as known in the art, such as, for example, progressive edge growth, without deviating from the inventive concept. Moreover, it is noted that while a fourth submatrix of the irregular QC-LDPC matrix formed by blocks corresponding to an intersection of entries of a first subset 30b of the second columns 30a-30c and entries of the first rows 32 has a (lower) triangular structure for easy encoding, the fourth submatrix may also have a dual-diagonal structure as, for example, shown in FIG. 4, or any other structure.

Figure 4:
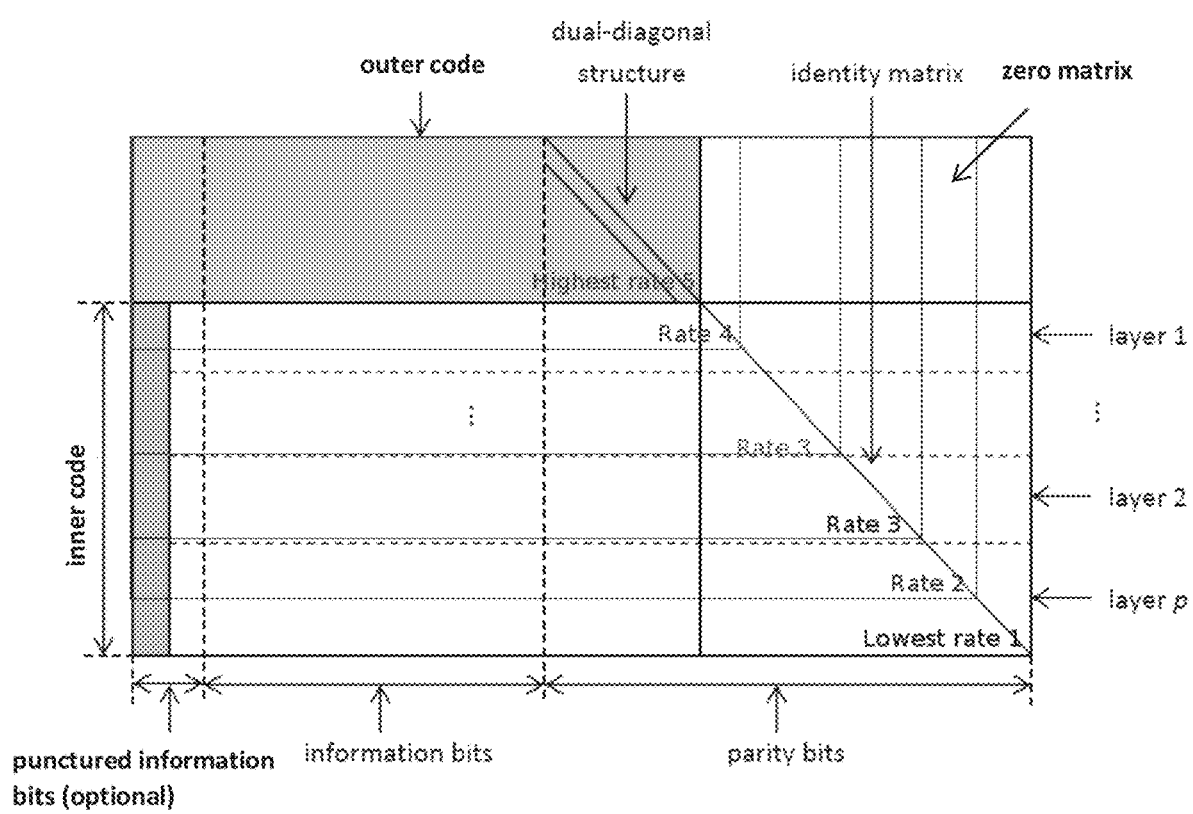
FIG. 4 illustrates rate adaption based on a base matrix of an irregular QC-LDPC code provided in accordance with the process of FIGS. 2 and 3.

Moreover, as illustrated in FIG. 4, an irregular QC-LDPC matrix generated using the process depicted in FIG. 2 and FIG. 3 may be divided into an outer code comprising blocks represented by entries of the one or more first rows 32 and an inner code represented by entries of the second rows 34a, 34b. Moreover, as indicated above, the second rows 34a, 34b may be further divided into layers of orthogonal rows when neglecting the blocks represented by the first columns 28 which may, for example, be punctured. In other words, the irregular QC-LDPC matrix may comprise a "core" base matrix in a high-density part (indicated in grey on the upper left of FIG. 4) forming the outer code and a rate-adaptable extension part forming the inner code.

Furthermore, it is note that although the example of FIG. 3 shows a base matrix B of an irregular QC-LDPC code that is divided into first columns 28 and second columns 30a-30c having a lower weight than the first columns 28, the base matrix B may also comprise one or more first columns 28 and one or more third columns 28' of lower weight than the one or more first columns 28. In addition, the one or more third columns 28' may also be punctured as indicated in FIG. 4. Moreover, it is to note that rows and columns can be freely permutated without affecting code performance so that, in view of code performance, any depicted base matrix B or base matrix structure 38 is in fact equivalent to any other base matrix B or base matrix structure 38 that is comprised of the same rows and columns. The same applies to the principles discussed in relation thereto.

Continuing with FIG. 4, if a highest rate is required, the information sequence $IS_1$ may be encoded using only the shift values of the core base matrix. If lower rates are acceptable, additional second rows and columns can be appended to the core base matrix. As discussed above, the additional second rows have a lower weight than the first rows of the core base matrix and provide (in combination with the added 'corresponding' second columns) for additional parity bits in the codeword to be transmitted. Thus, it is to be noted that in addition to enabling the encoder 12 and the decoder 14 to perform encoding and decoding operations on basis of the provided base matrix B, the encoder 12 and the decoder 14 may also use the provided base matrix B to derive irregular QC-LDPC child codes of different rates in accordance with different transmission scenarios, e.g., transmission scenarios which differ from each other in view channel quality and/or throughput requirements, by, for instance, removing (or neglecting) second rows and/or second columns of the inner code.

As shown in FIG. 4, an overlap (intersection) between additional second rows and columns (which may be referred to as a fifth submatrix) may form an identity matrix to facilitate encoding of the inner code, although a dual diagonal or (lower) triangular form may also be used instead. Moreover, the part of the base matrix B representing the outer code may comprise one, two, three, or more higher weight columns which may have a substantially higher weight than all other columns of the outer code. For example, one, two, or all higher weight first columns may have no empty cells, i.e., no entries representing the zero matrix. Furthermore, as discussed above, variable nodes corresponding to the one or more higher weight first columns 28 and/or variable nodes corresponding to one or more third columns 28' may be indicated as punctured and the "remaining" subrows may be grouped into (non-overlapping) layers of orthogonal subrows (or row vectors) to allow for layered decoding operations that are to be executed in parallel. Furthermore, the first (and second) quadratic submatrices of the base matrix B may be treated as single circulant submatrices during decoding.

Figure 5:
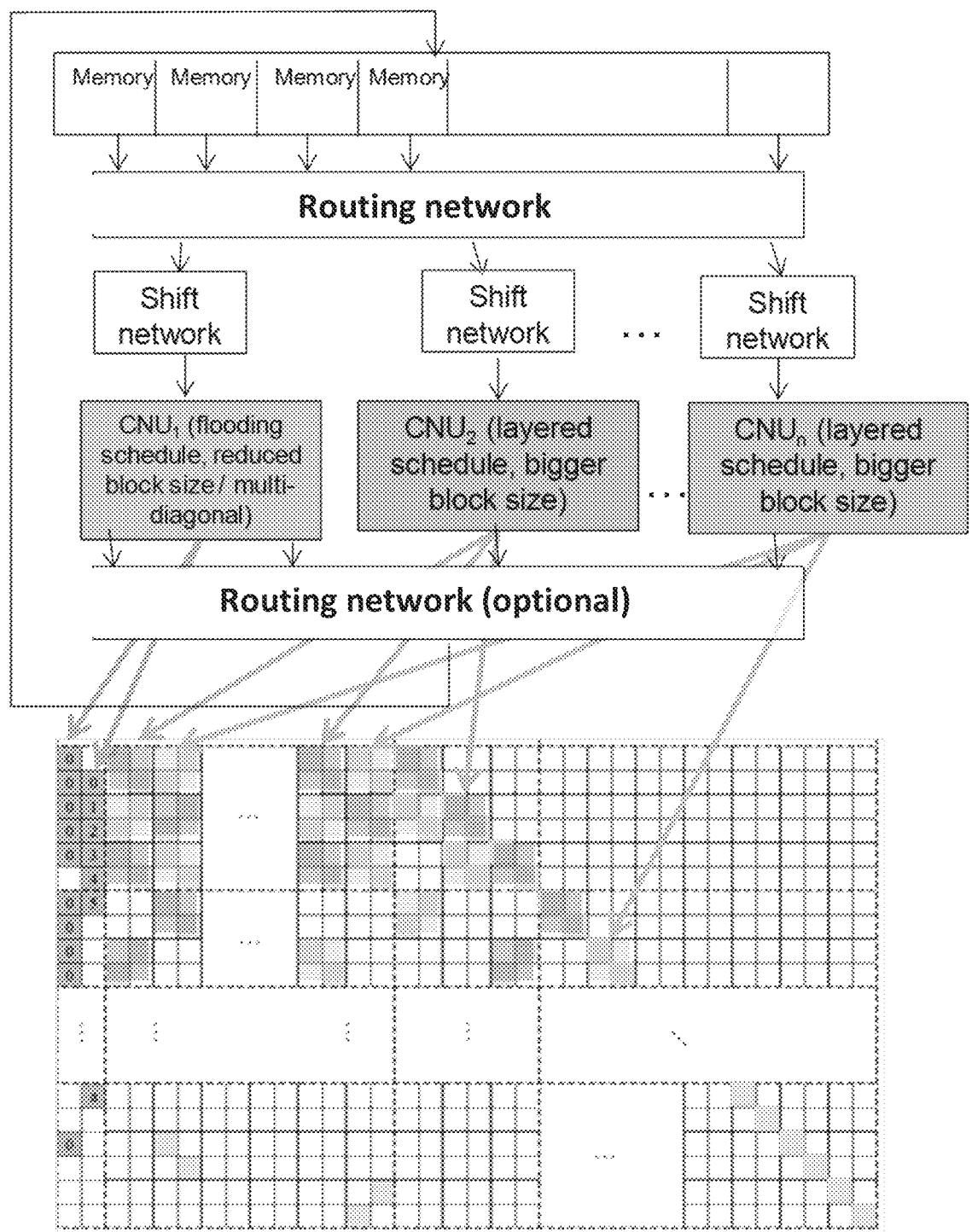
FIG. 5 shows a flow chart of a decoding process employing an irregular QC-LDPC code provided in accordance with the process of FIGS. 2 and 3.

FIG. 5 schematically illustrates such a decoding process in which one or more check node unit (CNU) processors perform flooding or a combination of flooding and layered (hence hybrid) decoding operations in view of the one or more higher weight first columns 28 and one or more CNU processors perform layered decoding operations in view of the second columns 30a-30c. In this regard, it is to note that the block size of the higher weigh first columns 28 may be smaller than the block size of the lower weight second columns 30a-30c which means that orthogonal groups of blocks may be effectively treated as a single block. Moreover, if the CNU processors work in a serial manner for a dedicated set of columns (e.g., assigned offline during the decoder design process), no routing network to connect the CNU processors with the memory may be required.

Figure 6:
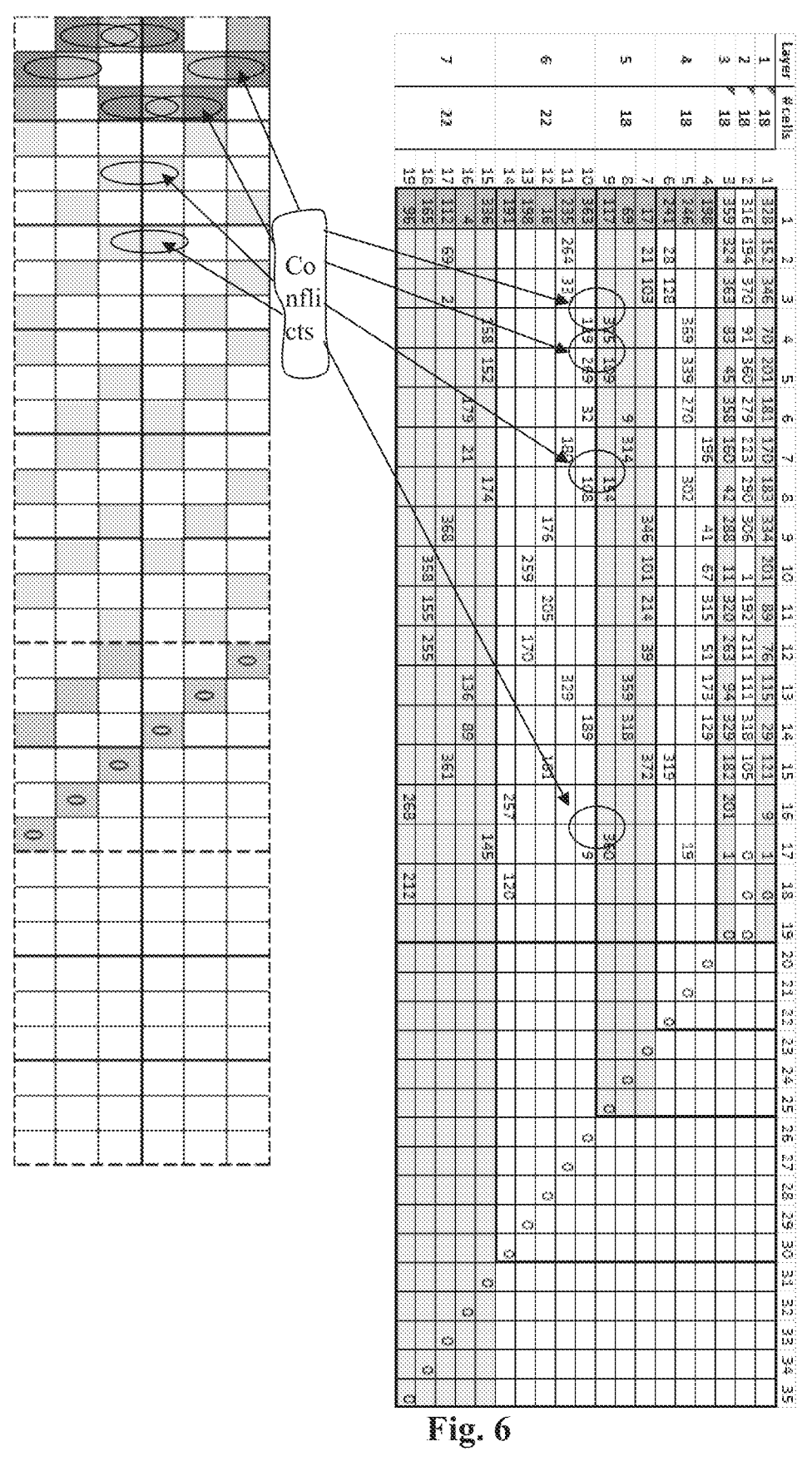

However, the double orthogonality property of the first (and second) quadratic submatrices does not guarantee to avoid stalls while performing layered decoding operations (the same applies to layers formed by groups or submatrices of orthogonal second rows). Rather, as shown in FIG. 6, stalls may occur if a labelled entry of a decoding layer is located (vertically) right below another labelled entry of another (preceding) decoding layer. In this regard, it is to note that the rows in the example of FIG. 6 are in a selected decoding order while it is to note that basically any decoding order may be established between the rows. Moreover, in case of orthogonally labelled quadratic submatrices, conflicts between layers may only exist between vertically adjacent first (and/or second) quadratic submatrices which, as indicated above, may be resolved by replacing an orthogonally labelled quadratic submatrix with another orthogonally labelled quadratic submatrix.

Moreover, if the number of conflicts for a given decoding order is small, they may be resolved by introducing additional pauses in the layered decoding operations. However, if the number of conflicts is too large, this may lead to either low throughput or to performance degradation if locally switching to a flooding schedule to avoid stalls. Hence, the presence of a large number of conflicts should be avoided for at least one decoding order when generating the base matrix B. For example, the total number of conflicts that are allowed to occur in anticipated decoding order may be limited by a certain threshold maxNC (e.g. maxNC=10). Moreover, different nested child codes as shown in FIG. 4 having different rates may "allow" for a different number of conflicts in terms of meeting a performance requirement imposed on the respective child code. For instance, for (child) codes of different rates $R_1, R_2, \ldots R_k$ or for (child) codes of a rate range $[R_{lowest}, R_{highest}]$ thresholds $maxNC_1, maxNC_2, \ldots maxNC_k$ or a single threshold maxNC may be enforced while for other rates no threshold may be set during the code design process.

In an example embodiment, the irregular QC-LDPC matrix of the code may be the following matrix shown in FIG. 10 with no conflicts in the extension part or its extension to the lower rates.

One should note that in the kernel part of this matrix all information columns (except for 2 punctured ones) have weight 3 and non-zero circulants are located in the first 3 rows. Extension part of the above matrix has no conflicts in the non-punctured information columns and contains conflicts in all parts of the rows in the punctured columns.

Figure 7:
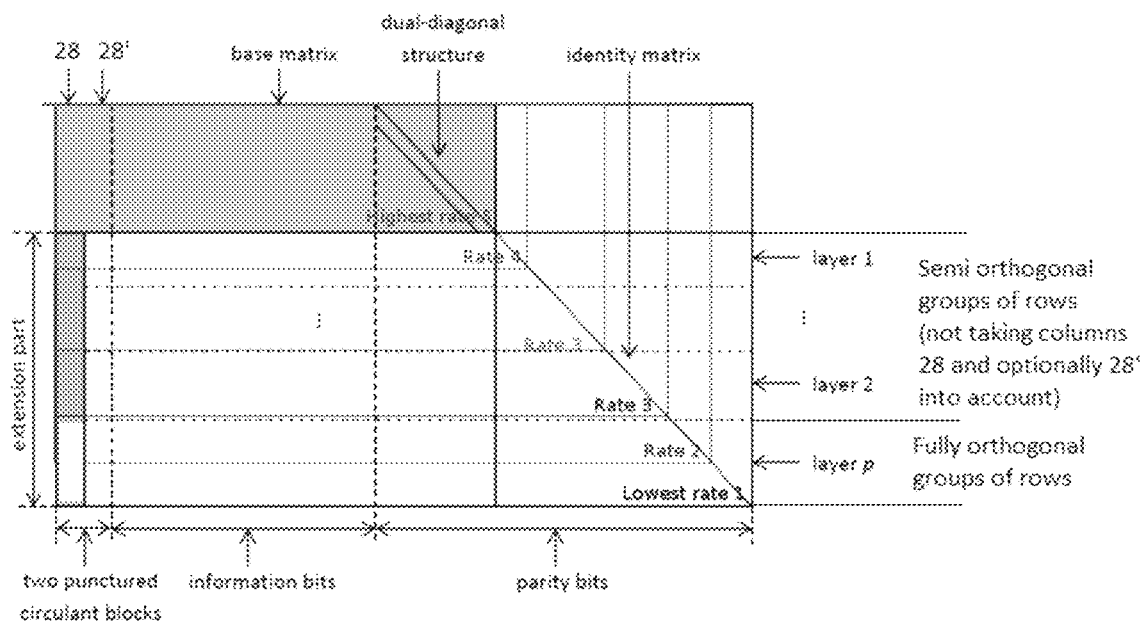
FIG. 7 shows an example of a base matrix of an irregular QC-LDPC code with quasi-orthogonal and fully-orthogonal groups of rows.

In a further embodiment, there exists a row processing order, such that, starting from some row/rate of the matrix, both columns 28 and 28' in FIG. 4 may have the orthogonality property, namely the property that for some groups of rows there are no vertically adjacent non-zero circulants within each such group. This is illustrated in FIG. 7.

Figure 8:
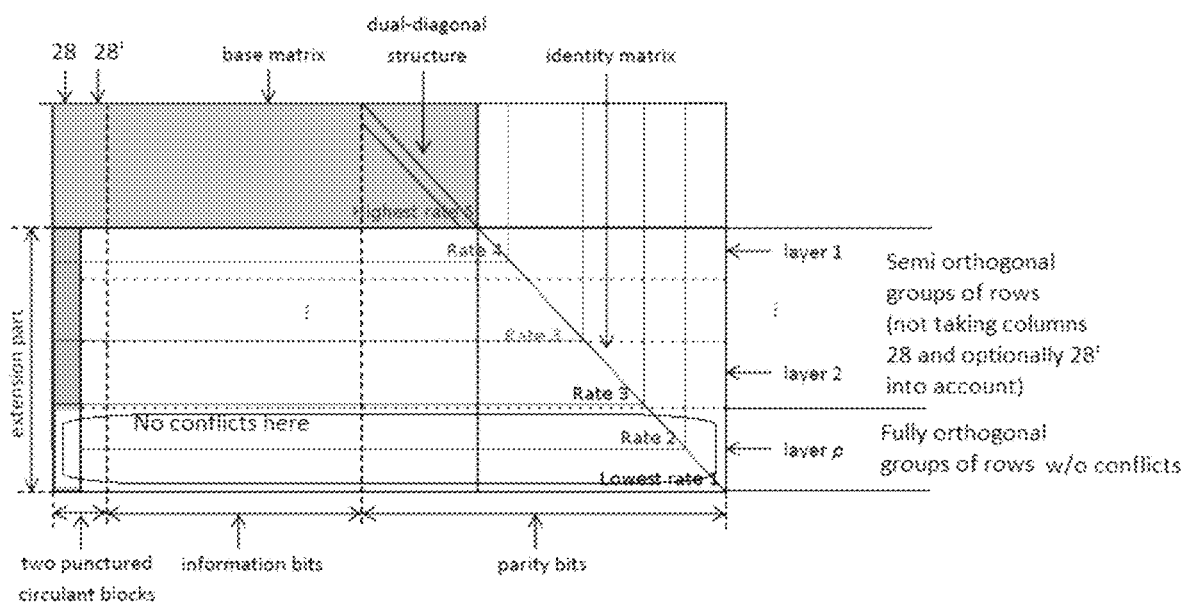
FIG. 8 shows an example of a base matrix of an irregular QC-LDPC code with quasi-orthogonal and fully-orthogonal non-conflict extension.

Special type of such a case is when there are no conflicts between any two adjacent rows in this fully orthogonal extension, or when the number of conflicts is limited by some threshold. This is illustrated in FIG. 8.

Figure 9:
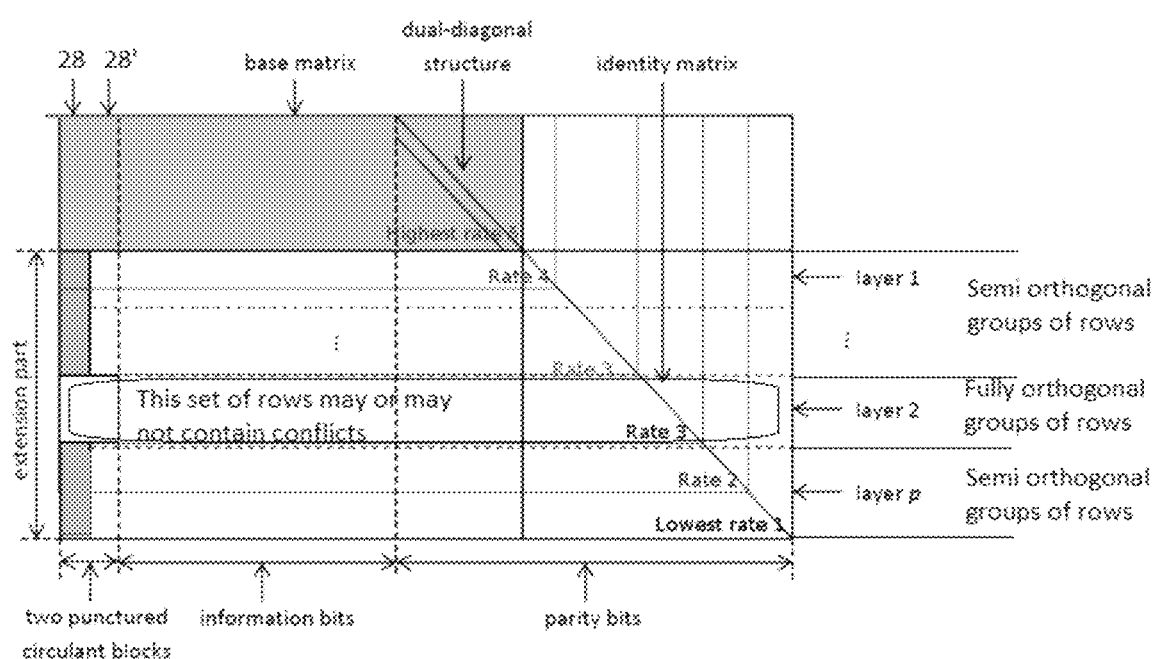
FIG. 9 shows an example of a base matrix of an irregular QC-LDPC code with fully orthogonal set of rows corresponding to subrange of rates.

In another embodiment, such group of rows (corresponding to range of rates of the nested code and corresponding processing order of them) may correspond to a subset of rows of the matrix not necessarily equal to the lowest rows of the base matrix (PCM matrix). Special type of such case is when there are now conflicts between any two adjacent rows in this subset of rows. This is illustrated in FIG. 9.

What is claimed is:

1. A method, applied to a processor of a computer, the method comprising:
   providing a base matrix of an irregular Quasi-Cyclic Low-Density Parity-Check (QC-LDPC) code for encoding or decoding a sequence of information bits, wherein providing the base matrix comprises:
      determining one or more first columns of the base matrix to have a higher weight than second columns of the base matrix;
      determining one or more first rows of the base matrix to have a higher weight than second rows of the base matrix;
      dividing a first submatrix formed by an intersection of entries of the second columns and entries of the second rows into first quadratic submatrices;
      labelling at most one entry in each column of each first quadratic submatrix and/or labelling at most one entry in each row of each first quadratic submatrix;
      labelling entries of the one or more first columns and entries of the one or more first rows;
      determining a codeword corresponding to the sequence of information bits based on labelled entries of the provided base matrix; and
      wirelessly transmitting, from a transmitting side to a receiving side, the codeword except for information bits that are indicated as punctured,
   wherein the labelled entries represent blocks of an irregular QC-LDPC matrix corresponding to circulant matrices and not-labelled entries represent blocks of the irregular QC-LDPC matrix corresponding to zero matrices, and wherein the irregular OC-LDPC matrix comprises a core base matrix in a high-density part forming an outer code and a rate-adaptable extension part forming an inner code, and
   wherein there is at least one row order, involving all rows of the first submatrix, in which the rows of each of the first quadratic submatrices or in which the rows of the first submatrix, ordered according to the at least one row order, are free of vertically adjacent entries, wherein stalls induced by the vertically adjacent entries between decoding layers are avoided for a highest rate code by disallowing vertically adjacent entries that are susceptible to layered decoding operations.

2. The method of claim 1, wherein there is at least one row order, involving all rows of the first submatrix, in which all labelled entries of each column of a matrix formed by the rows of the first submatrix, ordered according to the at least one row order, are vertically separated by at least two not-labelled entries.

3. The method of claim 1, wherein the one or more first rows are first rows and the labelling the entries of the first rows further comprises:
   dividing a second submatrix of the base matrix formed by an intersection of entries of the second columns and entries of the first rows into second quadratic submatrices; and
   labelling at most one entry in each column of each second quadratic submatrix and/or labelling at most one entry in each row of each second quadratic submatrix.

4. The method of claim 3, wherein the rows of each of the second quadratic submatrices or in which the rows of the second submatrix, ordered according to the at least one row order, are free of vertically adjacent entries.

5. The method of claim 3, wherein all labelled entries of each column of a matrix formed by the rows of the second submatrix, ordered according to the at least one row order, are vertically separated by at least two not-labelled entries.

6. The method of claim 1, wherein there are one or more third submatrices of the base matrix, obtainable by removing one or more of the second rows and/or the second columns of the base matrix,
   wherein a number of labelled entries that are vertically adjacent or within a vertical distance in columns of a fourth matrix formed by rows of the first submatrix and corresponding one or more row vectors of the one or more first rows, reordered according to the at least one row order, of the base matrix and the one or more third submatrices, respectively, is below a threshold, wherein a highest threshold is assigned to the base matrix and a lowest threshold is assigned to the third submatrix corresponding to a QC-LDPC code having a highest rate of QC-LDPC codes corresponding to the one or more third submatrices.

7. The method of claim 6, wherein the lowest threshold is one.

8. The method of claim 1, wherein a fourth submatrix of the irregular QC-LDPC matrix formed by blocks corresponding to an intersection of entries of a first subset of the second columns and entries of the first rows has a dual-diagonal or triangular structure.

9. The method of claim 1, wherein a fifth submatrix of the irregular QC-LDPC matrix formed by blocks corresponding to an intersection of entries of a second subset of the second columns and entries of the second rows has a triangular or identity matrix structure.

10. The method of claim 1, wherein to-be-labelled entries of the second columns are identified by entries of a base matrix structure divided into blocks of circulant submatrices and zero submatrices.

11. The method of claim 10, wherein to-be-labelled entries of the first columns are identified by entries of the base matrix structure comprising blocks of multi-diagonal circulant submatrices.

12. The method of claim 1, wherein there is at least one row order, involving all rows of the base matrix, wherein rows of the base matrix ordered according to at least one row order, starting from a given row are orthogonal rows.

13. The method of claim 1, wherein there is at least one row order, involving all rows of the base matrix, wherein a submatrix formed by a given set of rows of the base matrix, ordered according to the at least one order, consists of orthogonal groups of rows.

14. The method of claim 13, wherein there are no vertically adjacent pairs of labelled entries between the orthogonal groups of rows.

15. The method of claim 13, wherein a number of conflicts between groups of orthogonal rows is limited by a threshold.

16. The method of claim 1, further comprising:
determining a codeword corresponding to the sequence of information bits based on labelled entries of the provided base matrix.

17. The method of claim 16, further comprising:
transmitting the codeword except for information bits that are indicated as punctured.

18. The method of claim 1, further comprising:
indicating information bits corresponding to the one or more first columns as punctured.

19. The method of claim 1, further comprising:
decoding a received sequence of information bits based on entries of the base matrix, wherein the decoding comprises flooding and layered decoding operations, wherein the layered decoding operations are based on the first submatrix.

20. A non-transitory computer-readable medium storing processor-executable instructions which, when executed by a processor of a computer cause the computer to:
provide a base matrix of an irregular Quasi-Cyclic Low-Density Parity-Check (QC-LDPC) code for encoding an decoding a sequence of information bits, wherein providing the base matrix comprises:
determining one or more first columns of the base matrix to have a higher weight than second columns of the base matrix;
determining one or more first rows of the base matrix to have a higher weight than second rows of the base matrix;
dividing a first submatrix formed by an intersection of entries of the second columns and entries of the second rows into first quadratic submatrices;
labelling at most one entry in each column of each first quadratic submatrix and/or labelling at most one entry in each row of each first quadratic submatrix;
labelling entries of the one or more first columns and entries of the one or more first rows;
determining a codeword corresponding to the sequence of information bits based on labelled entries of the provided base matrix; and
wirelessly transmitting, from a transmitting side to a receiving side, the codeword except for information bits that are indicated as punctured,
wherein the labelled entries represent blocks of an irregular QC-LDPC matrix corresponding to circulant matrices and not-labelled entries represent blocks of the irregular QC-LDPC matrix corresponding to zero matrices, and wherein the irregular OC-LDPC matrix comprises a core base matrix in a high-density part forming an outer code and a rate-adaptable extension part forming an inner code, and wherein there is at least one row order, involving all rows of the first submatrix, in which the rows of each of the first quadratic submatrices or in which the rows of the first submatrix, ordered according to the at least one row order, are free of vertically adjacent entries, wherein stalls induced by the vertically adjacent entries between decoding layers are avoided for a highest rate code by disallowing vertically adjacent entries that are susceptible to layered decoding operations.

* * * * *

UNITED STATES PATENT AND TRADEMARK OFFICE
CERTIFICATE OF CORRECTION

PATENT NO. : 11,095,317 B2
APPLICATION NO. : 16/506696
DATED : August 17, 2021
INVENTOR(S) : Panteleev et al.

It is certified that error appears in the above-identified patent and that said Letters Patent is hereby corrected as shown below:

On the Title Page

Foreign Application Priority Data (30): "Mar. 21, 2017 (WO) ............... PCT/RU2017/000002" should read -- Jan. 9, 2017 (WO) ............... PCT/RU2017/000002 --.

Signed and Sealed this
Twelfth Day of July, 2022

Katherine Kelly Vidal
*Director of the United States Patent and Trademark Office*